(12) United States Patent
Kononchuk et al.

(10) Patent No.: US 12,550,636 B2
(45) Date of Patent: Feb. 10, 2026

(54) SUPPORT SUBSTRATE MADE OF SILICON SUITABLE FOR RADIOFREQUENCY APPLICATIONS AND ASSOCIATED MANUFACTURING METHOD

(71) Applicants: Soitec, Bernin (FR); Applied Materials Inc., Santa Clara, CA (US)

(72) Inventors: Oleg Kononchuk, Bernin (FR); Christophe Maleville, Bernin (FR); Isabelle Bertrand, Bernin (FR); Youngpil Kim, Bernin (FR); Chee Hoe Wong, Bernin (FR)

(73) Assignees: Soitec, Bernin (FR); Applied Materials Inc., Santa Clara, CA (US)

( * ) Notice: Subject to any disclaimer, the term of this patent is extended or adjusted under 35 U.S.C. 154(b) by 328 days.

(21) Appl. No.: 18/261,605

(22) PCT Filed: Dec. 23, 2021

(86) PCT No.: PCT/FR2021/052443
§ 371 (c)(1),
(2) Date: Jul. 14, 2023

(87) PCT Pub. No.: WO2022/152990
PCT Pub. Date: Jul. 21, 2022

(65) Prior Publication Data
US 2024/0071755 A1    Feb. 29, 2024

(30) Foreign Application Priority Data
Jan. 15, 2021   (FR) ...................................... 2100371

(51) Int. Cl.
*H01L 21/02* (2006.01)
*H01L 21/322* (2006.01)
(Continued)

(52) U.S. Cl.
CPC .. *H01L 21/02381* (2013.01); *H01L 21/02532* (2013.01); *H01L 21/3225* (2013.01); *H01L 21/76254* (2013.01); *H01L 23/66* (2013.01)

(58) Field of Classification Search
None
See application file for complete search history.

(56) References Cited

U.S. PATENT DOCUMENTS

| | | |
|---|---|---|
| 2015/0168326 A1 | 6/2015 | Allibert |
| 2018/0114720 A1 | 4/2018 | Wang et al. |

(Continued)

FOREIGN PATENT DOCUMENTS

FR      2985812      7/2013

OTHER PUBLICATIONS

International Search Report for International Application No. PCT/FR2021/052443 dated Apr. 8, 2022, 2 pages.

(Continued)

*Primary Examiner* — Jack S Chen
(74) *Attorney, Agent, or Firm* — TraskBritt (57) ABSTRACT

A support substrate for a radiofrequency application comprises: —a base substrate made of monocrystalline silicon comprising P-type dopants and having a resistivity that is greater than or equal to 250 ohm·cm and strictly less than 500 ohm·cm, and a content of interstitial oxygen between 13 ppma and 19 ppma, —an epitaxial layer made of monocrystalline silicon comprising P-type dopants, disposed on the base substrate and having a thickness between 2 microns and 30 microns, an upper portion at least of the epitaxial layer having a resistivity greater than 3000 ohm·cm, —a charge-trapping layer made of polycrystalline silicon having a resistivity greater than or equal to 1000 ohm·cm and a thickness between 1 micron and 10 microns. A method is used for manufacturing such a support substrate.

19 Claims, 3 Drawing Sheets

(51) Int. Cl.
    *H01L 21/762*     (2006.01)
    *H01L 23/66*     (2006.01)

(56) References Cited

U.S. PATENT DOCUMENTS

| | | |
|---|---|---|
| 2019/0115248 A1 | 4/2019 | Castex et al. |
| 2020/0126847 A1 | 4/2020 | Wang et al. |
| 2020/0266099 A1 | 8/2020 | Liu |
| 2024/0071755 A1* | 2/2024 | Kononchuk ...... H01L 21/02002 |

OTHER PUBLICATIONS

International Written Opinion for International Application No. PCT/2021/052443 dated Apr. 8, 2022, 5 pages.
Kononchuk et al., "Silicon-on-insulator Soi Technology: Manufacture and Applications", Woodhead Publishing Series in Electronic Series in Electronic and Optical Materials, https://www.kinokuniya.co.jp/f/dsg-02-9780857095268, Jan. 31, 2017, 4 pages.

\* cited by examiner

SUPPORT SUBSTRATE MADE OF SILICON SUITABLE FOR RADIOFREQUENCY APPLICATIONS AND ASSOCIATED MANUFACTURING METHOD

CROSS-REFERENCE TO RELATED APPLICATIONS

This application is a national phase entry under 35 U.S.C. § 371 of International Patent Application PCT/FR2021/052443, filed Dec. 23, 2021, designating the United States of America and published as International Patent Publication WO 2022/152990 A1 on Jul. 21, 2022, which claims the benefit under Article 8 of the Patent Cooperation Treaty to French Patent Application Serial No. FR2100371, filed Jan. 15, 2021.

TECHNICAL FIELD

The present disclosure belongs to the field of semiconductors and microelectronics. It relates to a support substrate made of silicon suitable for radiofrequency applications, and intended to support thin films, in particular, to form a silicon-on-insulator (SOI) structure. The present disclosure also relates to a method for manufacturing such a support substrate.

BACKGROUND

SOI (silicon-on-insulator) structures are widely used for radiofrequency (RF) applications.

Particularly known are SOI structures comprising a base substrate, a charge-trapping layer disposed on the substrate, a dielectric layer disposed on the trapping layer, and a semiconductor layer (the useful layer intended to receive the RF devices) disposed on the dielectric layer. The base substrate made of monocrystalline silicon usually has a resistivity greater than 3 kohm·cm and a low content of interstitial oxygen (Oi<10 ppma ASTM' 79). The trapping layer comprises non-doped polycrystalline silicon, having a thickness on the order of 2 microns. The combination of a high-resistivity base substrate made of silicon and a trapping layer makes it possible to eliminate a parasitic conduction layer usually present under the oxide layer buried in HR-SOI (silicon-on-insulator substrate with high-resistivity support substrate made of silicon) substrates. A review of the performance of RF devices manufactured on a high-resistivity semiconductor substrate is provided in "Silicon-on-Insulator (SOI) Technology, Manufacturing and Applications," points 10.7 and 10.8, Oleg Kononchuk and Bich-Yen Nguyen, from Woodhead Publishing.

An SOI structure with a base substrate having a low content of interstitial oxygen as mentioned above is electrically stable and therefore gives good performances to RF devices produced on or in the useful layer (namely, low insertion losses corresponding to a low signal attenuation, and a good linearity corresponding to a low distortion of the signal at the origin of harmonics). Nevertheless, it has a lower mechanical strength; indeed, it is likely to trigger slip-line defects, when high-temperature heat treatments are applied thereto, which leads to efficiency losses.

Another option involves implementing a base substrate having a standard resistivity on the order of 10-20 ohm·cm and an average content of interstitial oxygen (13-19 ppma ASTM'79). The trapping layer made of non-doped polycrystalline silicon then has a thickness greater than 20 microns, to guarantee the highly resistive character of the substrate. Such a structure has good electrical and mechanical stability, but suffers from a significant curvature (bow/warp) related to stress in the thick trapping layer; this can complicate its treatment in a microelectronic manufacturing line. This structure also has the disadvantage of requiring thick deposition and lengthy polishing of the trapping layer, which significantly increases the manufacturing costs.

Document US2018114720 proposes another SOI structure based on epitaxial growth of a silicon layer on a base substrate made of monocrystalline silicon; the base substrate has a resistivity greater than 500 ohm·cm and the epitaxial layer has a resistivity between 100 and 5000 ohm·cm. The trapping layer made of polycrystalline silicon is deposited on the epitaxial layer, and the oxide and silicon layers of the SOI structure are disposed on the trapping layer. According to one embodiment, the epitaxial layer comprises a concentration of n-type active dopants, less than 1E14 atoms/cm$^3$, the dopants being of the type opposite to that of the dopants of the base substrate, so that the epitaxial layer has a depleted zone having very high resistivity, which improves the performance of the radiofrequency devices produced on the structure.

Nevertheless, it is still necessary to optimize the mechanical and electrical properties of SOI structures, in order to meet the requirements of the various RF applications in just measure and maintain reasonable costs.

BRIEF SUMMARY

The present disclosure proposes a solution that addresses all or part of the above-mentioned drawbacks and problems. It relates, in particular, to a support substrate suitable for RF applications and capable of supporting surface layers, on and/or in which microelectronic devices will be produced. The present disclosure also relates to a method for manufacturing the support substrate.

The present disclosure relates to a support substrate for a radiofrequency application comprising:
  a base substrate made of monocrystalline silicon comprising P-type dopants and having a resistivity that is greater than or equal to 250 ohm·cm and strictly less than 500 ohm·cm, and a content of interstitial oxygen between 13 ppma and 19 ppma,
  an epitaxial layer made of monocrystalline silicon comprising P-type dopants, disposed on the base substrate and having a thickness between 2 microns and 30 microns, an upper portion at least of the epitaxial layer having a resistivity greater than or equal to 3000 ohm·cm, and
  a charge-trapping layer made of polycrystalline silicon having a resistivity greater than or equal to 1000 ohm·cm and a thickness between 1 micron and 10 microns.

According to advantageous features of the present disclosure, taken alone or in any feasible combination:
  the resistivity of the base substrate is less than or equal to 450 ohm·cm;
  the epitaxial layer has a thickness between 2 microns and 20 microns;
  the support substrate comprises at least one rough interface between the base substrate and the epitaxial layer, and/or between the epitaxial layer and the charge-trapping layer;
  the thickness of the epitaxial layer is defined as a function of the thickness of the trapping layer and as a function of a maximum second harmonic distortion value considered for the radiofrequency application, according to charts established for a quality factor representative of the second harmonic distortion.

The present disclosure also relates to a silicon-on-insulator structure comprising a useful layer disposed on a dielectric layer, the dielectric layer disposed on a support substrate as hereinbefore.

It also relates to an electronic device for radiofrequency application comprising at least one transistor disposed on and/or in the useful layer of a silicon-on-insulator structure as mentioned above.

The present disclosure finally relates to a method for manufacturing a support substrate as hereinbefore, the manufacturing method comprising the following steps:
a) providing the base substrate,
b) epitaxially growing a layer of monocrystalline silicon on the base substrate to form the epitaxial layer, and
c) depositing the charge-trapping layer on the epitaxial layer.

According to advantageous features of the present disclosure, taken alone or in any feasible combination:
the base substrate provided in step a) has a surface roughness greater than 10 nm RMS, even greater than 100 nm RMS, or even greater than 1 micron RMS;
step c) is followed by chemical-mechanical polishing of the charge-trapping layer so as to obtain a surface roughness of the support substrate less than or equal to 1 nm, on the side of its front face;
steps b) and c) are carried out in situ, in the same apparatus, a layer of silicon oxide being deposited on the epitaxial layer prior to the deposition of the charge-trapping layer;
the method comprises a design sequence prior to step a) or in step b), which includes:
i) defining the maximum second harmonic distortion value considered for the radiofrequency application, and
ii) choosing the thickness of the epitaxial layer and the resistivity of the base substrate from charts connecting a quality factor, representative of the second harmonic distortion, to the thickness of the epitaxial layer, for a given resistivity of the base substrate and for a given thickness of the trapping layer.

BRIEF DESCRIPTION OF THE DRAWINGS

Other features and advantages of the present disclosure will be clear from the detailed description, made in reference to the appended figures, in which.

The figures are schematic depictions that, for the sake of readability, are not to scale. In particular, the thicknesses of the layers along the z-axis are not to scale relative to the lateral dimensions along the x-axis and the y-axis.

DETAILED DESCRIPTION

Figure 1:
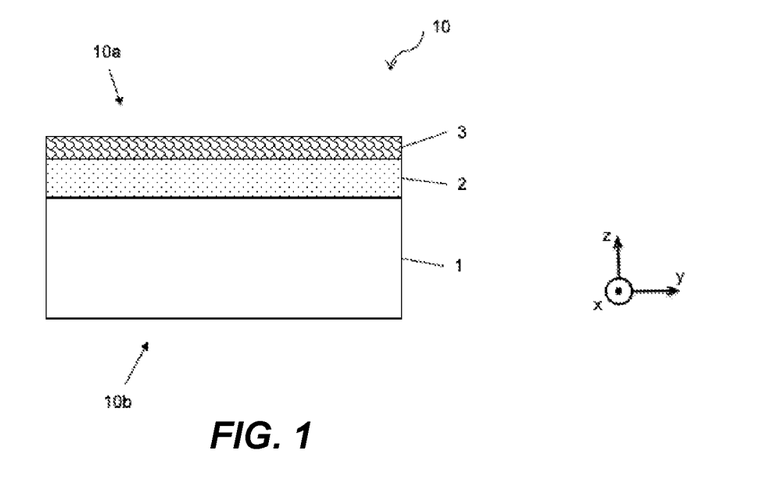
FIG. 1 shows a support substrate according to the present disclosure.

The present disclosure relates to a support substrate 10 made of monocrystalline silicon, having a front face 10a and a rear face 10b, substantially parallel to a main plane (x, y). The support substrate 10 is advantageously in the form of a small circular wafer, with a diameter between 200 mm and 450 mm. The support substrate 10 has a total thickness, along the z-axis normal to the main plane (x, y), which typically varies between a few hundred microns and 1000 microns.

The support substrate 10 comprises a base substrate 1 made of monocrystalline silicon resulting from drawing an ingot of Czochralski type (CZ). The base substrate 1 has a resistivity within a limited specific range, namely greater than or equal to 250 ohm·cm and strictly less than 500 ohm·cm. Advantageously, the resistivity of the base substrate 1 is between 250 ohm·cm and 450 ohm·cm. The base substrate 1 comprises P-type (boron) dopants, at low concentration to obtain resistivity in the above-mentioned range.

The base substrate 1 also has a content of interstitial oxygen (Oi) between 13 ppma and 19 ppma, corresponding to a low average content of Oi. Note that the ppma unit used here and in the rest of this disclosure is intended to refer to standard ASTM' 79. The range of Oi content corresponds to a concentration of Oi between 6.5E17 Oi/cm$^3$ and 9.5E17 Oi/cm$^3$.

The support substrate 10 also comprises, on the side of its front face 10a, an epitaxial layer 2 made of monocrystalline silicon comprising P-type (boron) dopants, disposed on the base substrate 1. The epitaxial layer 2 has a lower portion on the side of the base substrate 1 and sharing an interface with the latter, and an upper portion. At least the upper portion of the epitaxial layer 2 has a resistivity greater than or equal to 3000 ohm·cm: the resistivity of the upper portion of the epitaxial layer 2 may be, for example, 4000 ohm·cm, 5000 ohm·cm, 8000 ohm·cm, 10 kohm·cm, or even beyond.

The epitaxial layer 2 has a thickness between 2 microns and 30 microns. Advantageously, and nominally for cost purposes, the epitaxial layer 2 may have a thickness between 2 and 20 microns.

The epitaxial layer 2 is produced by epitaxial growth on the base substrate 1. Due to the method by which the epitaxial layer 2 is produced, the epitaxial layer 2 comprises a very low content of interstitial oxygen and thus has excellent electrical stability: typically, the epitaxial layer 2 is highly insensitive to resistivity fluctuations depending on the heat treatments applied to the support substrate 10.

Finally, the support substrate 10 includes a charge-trapping layer 3 made of polycrystalline silicon having a resistivity greater than or equal to 1000 ohm·cm, advantageously greater than or equal to 5000 ohm·cm. The trapping layer 3 has a thickness between 1 micron and 10 microns.

To allow the production of electronic devices, a useful layer, on or in which the devices will be located, can be transferred onto the support substrate 10.

Figure 2:
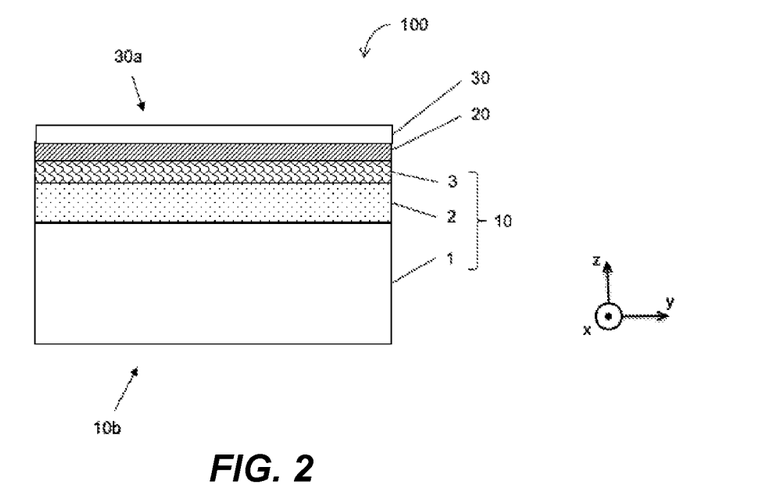
FIG. 2 shows a silicon-on-insulator structure comprising a support substrate, according to the present disclosure.

The present disclosure therefore also relates to a silicon-on-insulator (SOI) structure 100 shown in FIG. 2 comprising a useful layer 30 disposed on a dielectric layer 20, itself disposed on an above-mentioned support substrate 10.

The useful layer 30 is made of high-quality monocrystalline silicon and has a thickness typically between 20 nm and 200 nm. The dielectric layer 20, which may be made of silicon oxide for example, may have a thickness between 100 nm and 2000 nm.

The production of the SOI structure 100 is preferably based on the thin-film transfer method known as the Smart Cut™ method and briefly summarized below. A monocrystalline silicon donor substrate is implanted through its front face, so as to define a buried fragile plane substantially parallel to the front face and delimiting, with the front face, the thin film to be transferred. The implantation is usually done with light species such as ions of hydrogen, helium or a combination of these two species. The plane is referred to as the "fragile plane" because it comprises nano-cracks in lenticular form generated by the implanted light species.

According to a preferential option, the thin film to be transferred comprises, from the front face of the donor substrate toward the buried fragile plane, a dielectric layer 20 and a silicon layer 30, which respectively form the buried dielectric layer 20 and the useful silicon layer 30 of the SOI structure 100. It will therefore be understood that the energy for implantation of the light species is chosen and adjusted so as to form the buried fragile plane (more or less localized at the implantation peak) at the depth corresponding to the desired thickness of the useful layer 30, taking into account finishing steps (mentioned hereinafter) that consume a part of material of the layer 30.

The donor substrate and the support substrate 10 are then assembled, by direct bonding between the front faces of the substrates, to form a bonded assembly. Surface cleaning and/or activations, well known in the field of molecular adhesion bonding, may be applied to the substrates prior to assembly, in order to obtain excellent bonding quality. Assembly in a controlled atmosphere is also possible.

The separation at the buried fragile plane is preferentially carried out by applying a heat treatment at a medium temperature, typically between 350° C. and 500° C., which results in the growth of microcracks by coalescence and formation of pressurizing gaseous species, which induce the separation. Alternatively or jointly, the separation may be caused by the application of a mechanical stress to the bonded assembly.

At the end of this separation, an intermediate SOI structure is obtained, as well as the remainder of the donor substrate. Finishing sequences comprising cleaning operations, surface treatments (etching, polishing, etc.) and/or heat treatments are usually applied to the intermediate SOI structure, and aim to remove a portion of material from the transferred useful layer 30. This makes it possible to restore a good surface condition (low defectivity and roughness) and good crystalline quality to the useful layer 30 made of silicon. Following this, the SOI structure 100 is available for further processing.

The above-mentioned finishing heat treatments are usually carried out at temperatures between 900° C. and 1250° C.: the robustness of the base substrate 1 to slip-line-type defects and other plastic deformations is a considerable advantage during these treatments and makes it possible to preserve a very good integrity of the SOI structure 100.

Although the production of the SOI structure 100 has been described herein with reference to the Smart Cut™ method, such a structure may also be produced from other thin-film transfer methods known in the art.

The present disclosure likewise relates to an electronic device for radiofrequency applications. Such a device may, in particular, comprise at least one transistor disposed on the face 30a of the useful layer and/or in the useful layer 30 of the SOI structure 100 and produced according to CMOS (complementary metal oxide semiconductor) technology.

Such electronic devices may comprise RF switches, power amplifiers (PA), low noise amplifiers (LNA), transceivers, etc.

A resistivity in the range extending from 250 ohm·cm (included) to 500 ohm·cm (excluded) for the base substrate 1 of the support substrate 10 is thus selected in a very particular manner so as to provide both good electrical stability and good mechanical stability to the support substrate 10. Indeed, it has been observed that at 500 ohm·cm and beyond, there is a major risk of type flipping of the base substrate 1, when low-temperature annealing operations are applied (usually, passivation annealing in the methods for manufacturing microelectronic devices). This type flipping is highly detrimental to the RF performance of devices produced on or in the useful layer 30 disposed on the support substrate 10.

Figure 3:
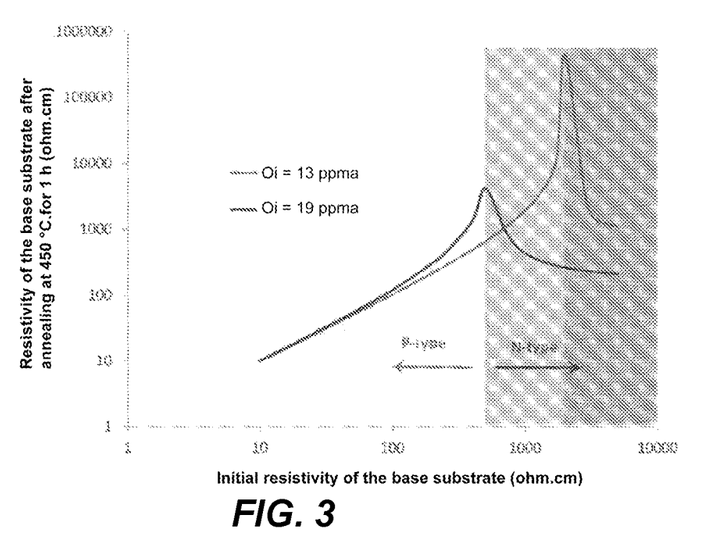
FIG. 3 shows curves connecting the initial resistivity and the resistivity after annealing at 450° C. for 1 h of base substrates having different concentrations of interstitial oxygen.

FIG. 3 illustrates two curves representing the resistivity of the base substrate 1 after an annealing operation at 450° C. for 1 h is applied thereto, depending on the initial resistivity of the substrate 1; the first curve is established for an Oi content of the base substrate 1 of 13 ppma, the second for an Oi content of 19 ppma. Identical behavior is observed with a peak corresponding to switching the base substrate 1 from type P to type N, due to the generation of thermal donors associated with the interstitial oxygen Oi. The peak for the lowest content of Oi is nevertheless substantially offset toward the highest initial resistivities. In order to take into account the uncertainties on the characteristics of the base substrate 1 and on the methods for producing devices (annealing duration and temperature, usually carried out around 450° C.), a maximum limit (excluded) has been defined for initial resistivity at 500 ohm·cm for the base substrate 1. The base substrate 1 is thus not a risk for type flipping during passivation annealing, at low temperature, usually applied in the final steps of manufacturing microelectronic devices. It therefore preserves, in a stable and reproducible manner, its initial resistivity. The lower limit is set at 250 ohm·cm because it is necessary to remain resistive to promote the RF performance of the future devices and to facilitate the production of the base substrates 1 (better performance during the drawing of the ingots).

Furthermore, the medium Oi content of the base substrate 1 makes it possible to greatly reduce the sensitivity of the support substrate 10 to slip lines. High-temperature heat treatments can thus be applied with greater flexibility.

The epitaxial layer 2, the thickness of which is adjustable according to the specifications of the RF application, between 2 microns and 30 microns, retains a very high level of resistivity regardless of the heat treatments applied to the support substrate 10, which is favorable to the RF performances of the electronic devices produced hereinbefore.

Finally, the trapping layer 3 performs its role of trapping charges generated below the dielectric layer 20 of the SOI structure 100. Charges thus do not degrade the high resistivity of the epitaxial layer 2.

Finally, the present disclosure relates to a method for manufacturing a support substrate 10 as previously described.

The manufacturing method comprises a step a) of providing the base substrate 1. The base substrate 1 is usually produced by sawing the CZ ingot, then by grinding the faces and edges of the substrate, by chemical etching and finally by chemical-mechanical polishing in order to achieve a surface roughness and quality, usual in the microelectronics field, namely less than 1 nm RMS at its front face. The RMS roughness is typically measured by atomic force microscopy (AFM) on a scanned surface of 5×5 microns or 20×20 microns.

According to an alternative embodiment of the method, the base substrate 1 may have a front face roughness greater than 10 nm RMS, even greater than 100 nm RMS, or even greater than 1 micron RMS. According to this variant, all or part of the chemical-mechanical polishing sequences usually applied to the base substrate 1 can be avoided, which is of great industrial interest.

The method then comprises a step b) of epitaxially growing a layer made of monocrystalline silicon on the base substrate 1, to form the epitaxial layer 2.

Epitaxial growth is carried out with a conventional method, typically at a temperature between 1050° C. and 1150° C. in an atmosphere comprising hydrogen and trichlorosilane ($H_2/HCl_3Si$). As is well known, the base substrate 1 is prepared prior to epitaxial growth, so as to eliminate as many surface contaminants (organic, metal, dopant, etc.) as possible and to remove the native oxide: all in order to generate an epitaxial layer 2 having a monocrystalline structure.

However, a high monocrystalline quality of the epitaxial layer 2 is not expected, and this is why the above-mentioned variant embodiment using a rough base substrate 1 can be implemented without negative impact. The important parameters of the epitaxial layer 2 have already been mentioned: these are its thickness and the resistivity at its upper portion. Thus, according to the variant embodiment, a rough interface is present between the base substrate 1 and the epitaxial layer 2; the surface of the upper portion of the epitaxial layer 2, at the end of its production, has a roughness on the same order of magnitude as that of the base substrate 1.

The manufacturing method also comprises a step c) of depositing the charge-trapping layer 3 on the epitaxial layer 2. For this purpose, a technique known from the state of the art may be used: for example, chemical vapor deposition (CVD) at atmospheric pressure, at a temperature between 900° C. and 1100° C., on a native oxide (not shown) present on the epitaxial layer 2. The presence of this native oxide provides the polycrystalline structure of the trapping layer 3. Alternatively, the trapping layer 3 may be deposited by a low-pressure chemical vapor deposition (LPCVD) technique at a temperature between 600° C. and 850° C.

Advantageously, steps b) and c) are carried out in situ, in the same apparatus (epitaxial reactor). In this case, a very thin film of silicon oxide (not shown) is deposited on the epitaxial layer 2 prior to the deposition of the charge-trapping layer 3, still with the aim of guaranteeing the polycrystalline structure of the trapping layer 3.

The in situ production of the two layers 2, 3 has the advantage of avoiding any contamination with boron of the interface between these layers, due to the epitaxial layer 2 coming into contact with the atmosphere of the clean room. The high resistivity of the upper portion of the epitaxial layer 2 and of the trapping layer 3 is thus not negatively impacted by the presence of traces of dopants (boron).

When the variant embodiment using the rough base substrate 1 is implemented, there is a rough area between the epitaxial layer 2 and the charge-trapping layer 3, or more specifically, there is a rough interface between the epitaxial layer 2 and the silicon oxide, and between the silicon oxide and the charge-trapping layer 3. The surface of the trapping layer 3 is also rough at the end of step c).

Step c) is therefore followed by chemical-mechanical polishing of the charge-trapping layer 3, so as to obtain a surface roughness of the support substrate 10 less than or equal to 1 nm RMS, or even less than 0.5 nm RMS. This low level of roughness may ensure that the support substrate 10 is compatible with the transfer methods of the useful layer 30 of the SOI structure 100.

It should be noted that chemical-mechanical polishing may also be applied outside the implementation of the variant embodiment using the rough base substrate 1.

According to an advantageous embodiment, the manufacturing method comprises a design sequence prior to step a) or step b). This sequence includes:

i) defining the maximum second harmonic distortion value HD2 considered for the radiofrequency application, ii) choosing the thickness of the epitaxial layer 2 and the resistivity of the base substrate 1 to be in the range extending from 250 ohm·cm (included) to 500 ohm·cm (excluded), from charts connecting a quality factor QF, representative of the second harmonic distortion HD2, to the thickness of the epitaxial layer 2, for a given resistivity of the base substrate 1 and for a given thickness of the trapping layer 3.

The second harmonic distortion HD2 is a well-known critical parameter for RF applications and can be evaluated from a test structure of the coplanar line type ("coplanar waveguide") developed on the support substrate 10, by applying an input signal of 15 dBm power with a frequency of 900 MHz. It is expressed in dBm. RF applications consider, for example, a maximum HD2 value of −80 dBm or −90 dBm, or else of −100 dBm for the most stringent ones among them, with an input power of the RF signal of 15 dBm.

The quality factor QF, representative of the second harmonic distortion HD2, is described in document FR2985812 (or US2015168326 of the same family). The content of this document is incorporated herein by reference. The quality factor is defined as:

$$QF = A * \ln\left(\int_0^D \sigma(x) \cdot e^{\frac{-x}{L}} \cdot dx\right) + B$$

Wherein D is the integration depth (which is at least greater than five times the length L), σ(x) is the electrical conductivity measured at the depth x of the substrate, L is a characteristic attenuation length of the electric field in the substrate, and A and B are empirical coefficients.

Figure 4:
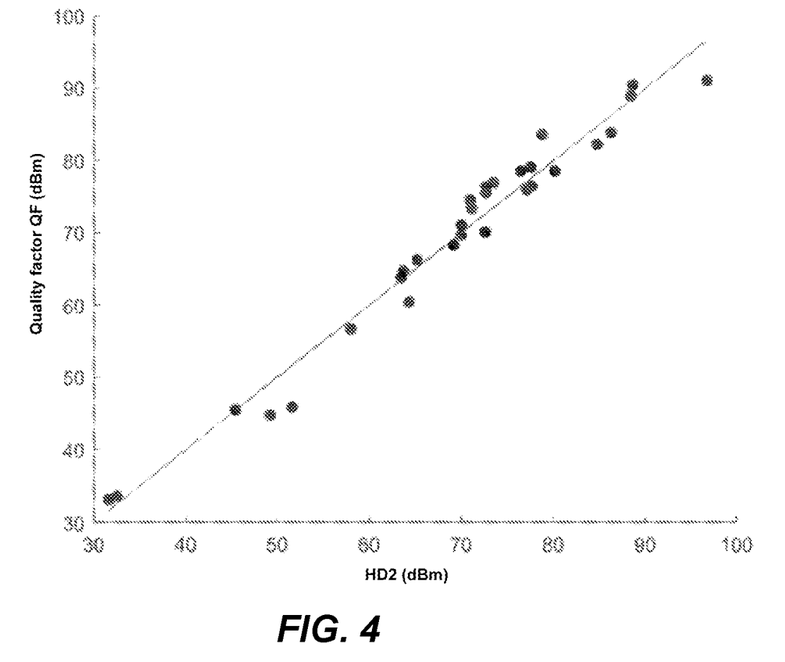
FIG. 4 shows a correlation between the quality factor QF and a second order harmonic distortion parameter HD2 or second harmonic distortion.

FIG. 4 shows the correlation between the quality factor QF expressed in dBm, and the parameter HD2 also expressed in dBm and measured on test components. It clearly appears that the quality factor QF, which does not require the manufacture of devices but only a measurement of the depth resistivity of the support substrate 10, is very closely correlated with the parameter HD2 and much easier to measure.

Figure 5:
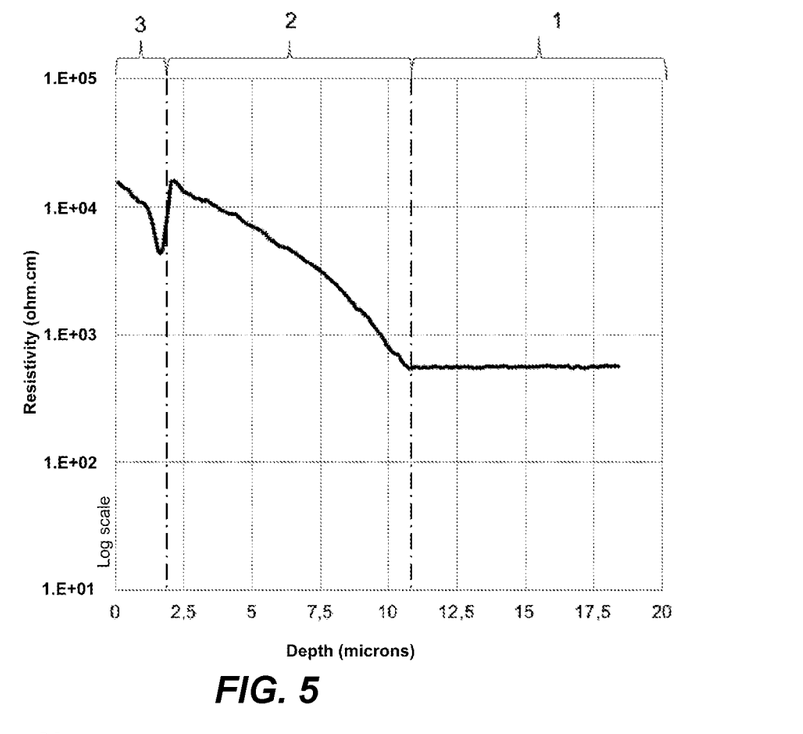
FIG. 5 shows a depthwise resistivity profile measured by SRP, of a support substrate according to the present disclosure.

In the present disclosure, the quality factor QF is estimated from the depth resistivity profile (connected to the electrical conductivity σ(x)) of the support substrate 10 (and in particular of the epitaxial layer 2), an example of which is given in FIG. 5. Such a profile may be measured by Spreading Resistance Profile (SRP) on a chamfered part of the support substrate 10, giving access to a measurement in the thickness.

It is noted that the resistivity profile of the epitaxial layer 2 increases continuously from its lower portion (on the side of the base substrate 1) toward its upper portion (on the side of the charge-trapping layer 3). This phenomenon is known in the case of epitaxial growth on a base substrate 1 comprising P-type (boron) dopants, as is the case herein. The boron on the surface of the substrate 1 is evaporated and condensed during epitaxial growth; then it is gradually diluted as the epitaxial layer 2 thickens, which enables a continuous increase in the resistivity of the layer 2. The increasing resistivity profile of the epitaxial layer 2 depends essentially on the epitaxial reactor used and on the resistivity of the base substrate 1.

In the example of FIG. 5, representative of a certain reactor, the base substrate has a resistivity of 450 ohm·cm; the epitaxial layer 2 has a thickness of about 10 microns and its upper portion (between about 2 microns and about 7 microns in depth on the graph) has a resistivity of between 3000 ohm·cm and about 15000 ohm·cm (on the logarithmic scale).

Figure 6:
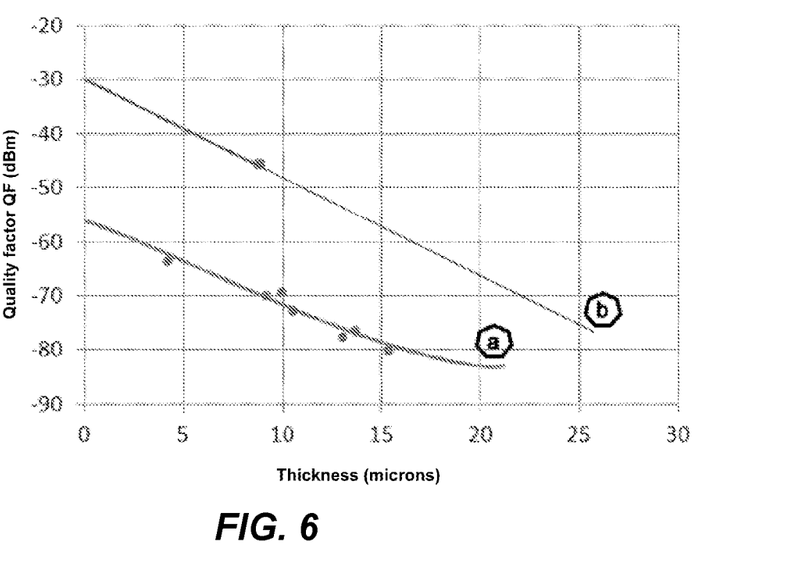
FIG. 6 shows a chart connecting the quality factor QF and the thickness of the epitaxial layer for a support substrate according to the present disclosure (a) and for a substrate outside the present disclosure (b).

FIG. 6 shows a chart correlating the quality factor QF and the thickness of the epitaxial layer 2, for a trapping layer 3 with a thickness of 2 microns and for two resistivities of the base substrate 1: (a) a resistivity of 450 ohm·cm according to the present disclosure, and (b) a resistivity of 10 ohm·cm outside of the present disclosure. The curves are simulations of the parameter QF, based on the observation that the profiles of increasing resistivity of the epitaxial layer 2 can be superimposed for the thicknesses of interest (between 2 and 30 microns); this of course for a given resistivity of the base substrate 1 and in a given reactor. It is therefore possible, from a measured profile, for example, for a thickness of the epitaxial layer 2 greater than 10 microns, to simulate/extrapolate the profiles of increasing resistivity for the thicknesses between 2 and 30 microns. The quality factor QF is then calculated from the simulated profiles for each thickness of epitaxial layer 2, giving rise to charts such as that presented in FIG. 6. Note that the points on the curves of FIG. 6 correspond to experimental measurements that reinforce the simulations.

In this example, for a quality factor QF of −80 dBm (corresponding to a maximum value of HD2 substantially equal to −80 dBm), the thickness of the epitaxial layer 2 of the support substrate 10 must be greater than 15 microns, typically between 15 microns and 18 microns. It can be seen that a thickness of about 30 microns or even greater in case (b) would be necessary, wherein the base substrate 1 has low resistivity, which does not appear economically viable.

Depending on the level of performance desired for the RF devices (for example, a maximum value of HD2 at −70 dBm, −80 dBm or −90 dBm, etc., for an input power of the RF signal of 15 dBm), it is therefore possible to adjust the thickness of the epitaxial layer 2, as well as the thickness of the trapping layer 3 and the resistivity of the base substrate 1 of the support substrate 10 according to the present disclosure, based on charts. These three parameters are defined in combination and adjusted with respect to one another, so that the support substrate 10 guarantees the RF performance of the devices.

The physical and electrical characteristics of the support substrate 10 can thus be defined as precisely as possible in order to respond to the intended RF application, and provide a good compromise between the RF performance and the costs/complexity of manufacturing the support substrate 10.

Of course, the present disclosure is not limited to the described embodiments and variant embodiments may be envisaged without departing from the scope of the invention as defined by the claims.

In particular, the useful layer 30 used for the production of the devices has been described in the context of an SOI structure, therefore made of silicon; but it is entirely conceivable that the useful layer 30 may comprise other types of materials, semiconducting or not. Likewise, the dielectric layer 20 may comprise different types of electrical insulating materials.

The invention claimed is:

1. A support substrate for a radiofrequency application, comprising:
   a base substrate made of monocrystalline silicon comprising P-type dopants and having a resistivity that is greater than or equal to 250 ohm·cm and strictly less than 500 ohm·cm, and a content of interstitial oxygen between 13 ppma and 19 ppma;
   an epitaxial layer made of monocrystalline silicon comprising P-type dopants, disposed on the base substrate and having a thickness between 2 microns and 30 microns, at least an upper portion of the epitaxial layer having a resistivity greater than or equal to 3000 ohm·cm; and
   a charge-trapping layer made of polycrystalline silicon disposed on the epitaxial layer, the charge-trapping layer having a resistivity greater than or equal to 1000 ohm·cm and a thickness between 1 micron and 10 microns.

2. The support substrate of claim 1, wherein the resistivity of the base substrate is less than or equal to 450 ohm·cm.

3. The support substrate of claim 2, wherein the epitaxial layer has a thickness between 2 microns and 20 microns.

4. The support substrate of claim 3, further comprising at least one rough interface between the base substrate and the epitaxial layer and/or between the epitaxial layer and the charge-trapping layer.

5. A silicon-on-insulator structure comprising a useful layer disposed on a dielectric layer, the dielectric layer disposed on a support substrate according to claim 1.

6. An electronic device for radiofrequency application comprising at least one transistor disposed on and/or in the useful layer of a silicon-on-insulator structure according to claim 5.

7. The support substrate of claim 1, wherein the epitaxial layer has a thickness between 2 microns and 20 microns.

8. The support substrate of claim 1, further comprising at least one rough interface between the base substrate and the epitaxial layer and/or between the epitaxial layer and the charge-trapping layer.

9. The support substrate of claim 8, wherein the at least one rough interface has a roughness greater than 10 nm RMS.

10. The support substrate of claim 9, wherein the at least one rough interface has a roughness greater than 100 nm RMS.

11. A method for manufacturing a support substrate, the method comprising the following steps:
   a) providing a base substrate made of monocrystalline silicon comprising P-type dopants and having a resistivity that is greater than or equal to 250 ohm·cm and strictly less than 500 ohm·cm, and a content of interstitial oxygen between 13 ppma and 19 ppma;
   b) epitaxially growing a layer made of monocrystalline silicon on the base substrate, to form an epitaxial layer made of monocrystalline silicon comprising P-type dopants, the epitaxial layer having a thickness between 2 microns and 30 microns, at least an upper portion of the epitaxial layer having a resistivity greater than or equal to 3000 ohm·cm; and c) depositing a charge-trapping layer on the epitaxial layer, the charge-trapping layer made of polycrystalline silicon, the charge-trapping layer having a resistivity greater than or equal to 1000 ohm·cm and a thickness between 1 micron and 10 microns.

12. The manufacturing method of claim 11, wherein:
the base substrate provided in step a) has a surface roughness greater than 10 nm RMS; and
step c) is followed by chemical-mechanical polishing of the charge-trapping layer, so as to obtain a surface roughness of the support substrate less than or equal to 1 nm on the side of a front face of the charge-trapping layer.

13. The manufacturing method of claim 12, wherein steps b) and c) are carried out in situ, in the same apparatus, and wherein the method further comprises depositing a layer of silicon oxide on the epitaxial layer prior to the deposition of the charge-trapping layer.

14. The manufacturing method of claim 13, further comprising performing a design sequence prior to step a) or step b), the design sequence comprising:
i) defining a maximum second harmonic distortion value for a radiofrequency application; and
ii) choosing the thickness of the epitaxial layer and the resistivity of the base substrate from charts correlating a quality factor, representative of the second harmonic distortion value, to the thickness of the epitaxial layer, for a given resistivity of the base substrate and for a given thickness of the trapping layer.

15. The manufacturing method of claim 12, wherein the base substrate has a surface roughness greater than 100 nm RMS.

16. The manufacturing method of claim 15, wherein the base substrate has a surface roughness greater than 1 micron RMS.

17. The support substrate of claim 10, wherein the at least one rough interface has a roughness greater than 1 micron RMS.

18. The manufacturing method of claim 11, wherein steps b) and c) are carried out in situ, in the same apparatus, and wherein the method further comprises depositing a layer of silicon oxide on the epitaxial layer prior to the deposition of the charge-trapping layer.

19. The manufacturing method of claim 11, further comprising performing a design sequence prior to step a) or step b), the design sequence comprising:
i) defining a maximum second harmonic distortion value for a radiofrequency application; and
ii) choosing the thickness of the epitaxial layer and the resistivity of the base substrate from charts correlating a quality factor, representative of the second harmonic distortion value, to the thickness of the epitaxial layer, for a given resistivity of the base substrate and for a given thickness of the trapping layer.

* * * * *